US009620495B2

(12) United States Patent
Besse et al.

(10) Patent No.: US 9,620,495 B2
(45) Date of Patent: Apr. 11, 2017

(54) SEMICONDUCTOR DEVICE AND AN INTEGRATED CIRCUIT COMPRISING AN ESD PROTECTION DEVICE, ESD PROTECTION DEVICES AND A METHOD OF MANUFACTURING THE SEMICONDUCTOR DEVICE

(75) Inventors: Patrice Besse, Tournefeuille (FR); Alexis Huot-Marchand, Fonsorbes (FR); Jean-Philippe Laine, Cugnaux (FR); Alain Salles, Ramonville St Agne (FR)

(73) Assignee: NXP USA, Inc., Austin, TX (US)

( * ) Notice: Subject to any disclaimer, the term of this patent is extended or adjusted under 35 U.S.C. 154(b) by 0 days.

(21) Appl. No.: 14/427,024

(22) PCT Filed: Sep. 12, 2012

(86) PCT No.: PCT/IB2012/002023
§ 371 (c)(1),
(2), (4) Date: Mar. 10, 2015

(87) PCT Pub. No.: WO2014/041388
PCT Pub. Date: Mar. 20, 2014

(65) Prior Publication Data
US 2015/0221629 A1  Aug. 6, 2015

(51) Int. Cl.
*H01L 27/02* (2006.01)
*H01L 29/74* (2006.01)
(Continued)

(52) U.S. Cl.
CPC .. *H01L 27/0248* (2013.01); *H01L 21/823418* (2013.01); *H01L 27/0262* (2013.01); *H01L 27/0623* (2013.01); *H01L 29/7436* (2013.01)

(58) Field of Classification Search
CPC ......... H01L 27/0248; H01L 21/823418; H01L 27/0262; H01L 27/0623; H01L 29/7436
See application file for complete search history.

(56) References Cited

U.S. PATENT DOCUMENTS 6,320,232 B1   11/2001   Gossner et al.
2008/0044955 A1   2/2008   Salcedo et al.
(Continued)

FOREIGN PATENT DOCUMENTS

JP   2010-182805 A   8/2010
WO   WO2013057537 A1   4/2013

OTHER PUBLICATIONS

International Search Report and Written Opinion correlating to PCT/IB2012/002023 dated Mar. 19, 2013.
(Continued)

*Primary Examiner* — Fernando L Toledo
*Assistant Examiner* — Neil Prasad
(74) *Attorney, Agent, or Firm* — Charlene R. Jacobsen

(57) ABSTRACT

A semiconductor device is provided which comprises an ESD protection device. The structure of the semiconductor device comprises a p-doped isolated region in which a structure is manufactured which operates as a Silicon Controlled Rectifier which is coupled between an I/O pad and a reference voltage or ground voltage. The semiconductor device also comprises a pnp transistor which is coupled parallel to the Silicon Controlled Rectifier. The base of the transistor is coupled to the gate of the Silicon Controlled Rectifier. In an optional embodiment, the base and gate are also coupled to the I/O pad.

8 Claims, 10 Drawing Sheets

(51) Int. Cl.
*H01L 21/8234* (2006.01)
*H01L 27/06* (2006.01)

(56) References Cited

U.S. PATENT DOCUMENTS

| | | |
|---|---|---|
| 2008/0246345 A1 | 10/2008 | Zecri et al. |
| 2008/0308837 A1 | 12/2008 | Gauthier, Jr. et al. |
| 2009/0116157 A1 | 5/2009 | Besse et al. |
| 2011/0176244 A1 | 7/2011 | Gendron et al. |
| 2011/0186909 A1 | 8/2011 | Tsai et al. |
| 2014/0159206 A1* | 6/2014 | Hsu .................. H01L 27/0259 257/565 |

OTHER PUBLICATIONS

Gendron, Amaury et al: "New High Voltage ESD Protection Devices Based on Bipolar Transistors for Automotive Applications", Electrical Overstress/Electrostatic Discharge Symposium (EOS/ESD), 2011 33rd, Sep. 11-16, 2011, Anaheim, CA, pp. 1-10.

* cited by examiner

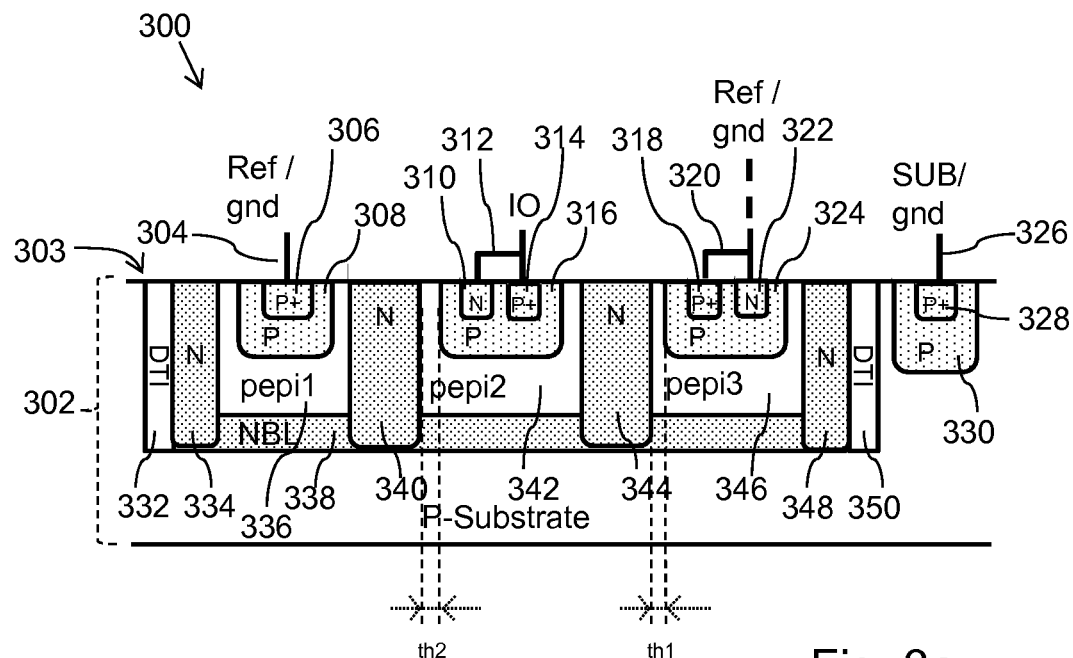
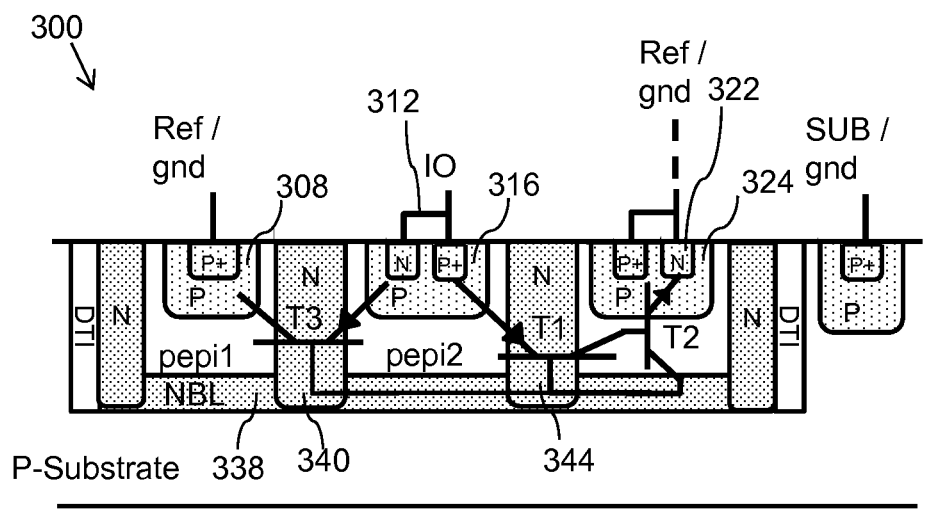

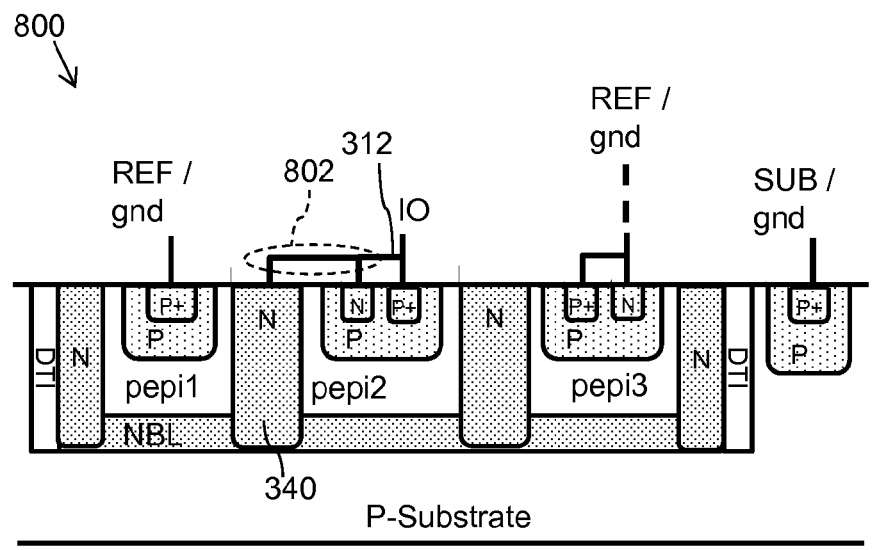
Fig. 8a
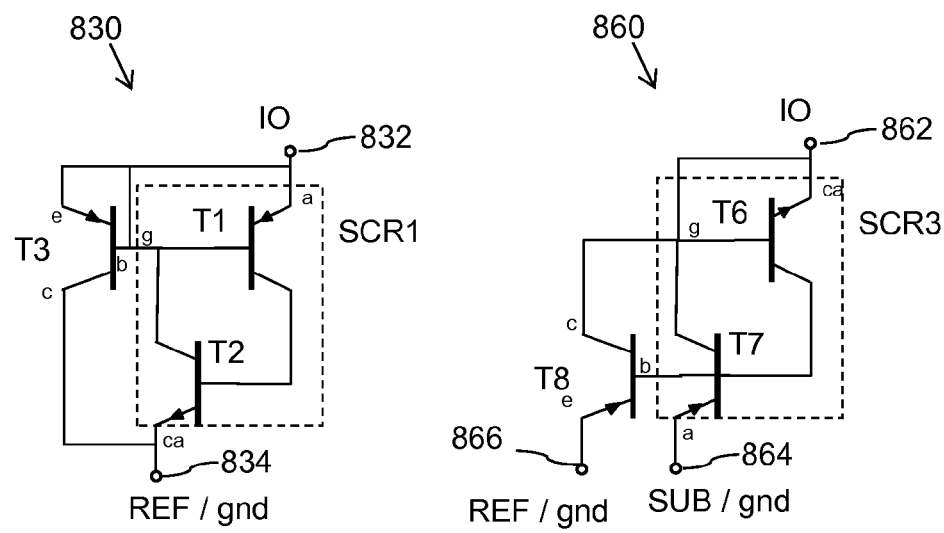
Fig. 8b
Fig. 8c

SEMICONDUCTOR DEVICE AND AN INTEGRATED CIRCUIT COMPRISING AN ESD PROTECTION DEVICE, ESD PROTECTION DEVICES AND A METHOD OF MANUFACTURING THE SEMICONDUCTOR DEVICE

FIELD OF THE INVENTION

This invention relates to ESD protection device which may be implemented on a semiconductor device. The invention further relates to an manufacturing method for manufacturing such a semiconductor device starting from a semiconductor substrate.

BACKGROUND OF THE INVENTION

Electrostatic discharge (ESD) is a problem in the utilization, manufacturing and/or design of the semiconductor devices. The integrated circuits manufactured on the semiconductor device can be damaged when ESD events are received from other circuits coupled to the semiconductor device or from people and/or machinery and tools touching the semiconductor device. During an ESD event the integrated circuit may receive a charge which leads to relatively large currents during a relatively short period of time. As the result of the large current (until several amps during tens of nanoseconds), the voltage inside the IC increases. If the resulting voltage, current, power or energy exceed a maximum capability of the circuits then it may create irreparable damage to the integrated circuit.

Today most integrated circuits comprise ESD protection circuitries that are able to conduct the charge of an ESD event to, for example, the ground without causing irreparable damage to the integrated circuit. Such ESD protection circuits are typically arranged near the I/O pads of the semiconductor device and are configured to conduct the charge of the ESD event directly to the ground before the current may reach the vulnerable portions of the integrated circuit.

In published article "New High Voltage ESD Protection Devices Based on Bipolar Transistors for Automotive Applications", Gendron A. et al, 33th Electrical Overstress/Electrostatic Discharge Symposium, 11-16 Sep. 2011, a cross-sectional view of the structure of an ESD protection device as presented in FIG. 1a and FIG. 2a are usable ESD protection devices for automotive applications. If the I/O pad of the semiconductor device 100 receives an ESD event of a positive voltage, the semiconductor device forms the indicated circuit of transistors T1 and T2 as presented in FIG. 1a and FIG. 1b. The circuit of transistors T1 and T2 form a thyristor-like circuit, also often indicated with the term Silicon Controlled Rectifier (SCR). As soon as the voltage across the reverse biased N-P junction from the central N-doped region towards the P-doped region 102 becomes higher than the breakdown voltage of this junction, an avalanche phenomenon by impact ionization is created. A hole current flows through from the p-doped region 102. The p-doped region is resistive and once the voltage difference between the N-doped region (which is connected to ground) and the p-doped region 102 becomes larger than 0.3 volt, transistor T2 starts to operate, and, thus, the presented SCR starts to conduct a current from the I/O pad towards the negative or ground voltage. Thus, the breakdown voltage of the discussed junction is the trigger voltage of the ESD protection device. The start of the operation of the SCR causes the reduction of the voltage across the ESD protection device. This reduction of the voltage is termed 'the snapback behaviour' of the ESD protection device. If, subsequently, the current through the ESD protection device increases, the voltage across the ESD protection device also increases until the failure of the structure. In FIG. 1c the typical behaviour of such an ESD protection device is presented. As shown in FIG. 1c, if the voltage of the ESD event raises to the trigger voltage $V_t$ the operation of the SCR starts and the voltage drops towards the holding voltage $V_h$. The difference between the trigger voltage $V_t$ and the holding voltage $V_h$ is called the snapback voltage $V_{sb}$. Subsequently, the ESD protection device is capable of conducting larger currents until the ESD protection device is damages at point 162.

As shown in FIG. 1b, in several prior art ESD protection devices, a diode D1 is arranged in parallel to the SCR. The aim of the diode is to provide a protection to negative ESD stress between IO and Neg, and that diverting the current since −0.3V that corresponds to the threshold voltage of a forward biased diode. The diode does not clamp voltage during positive stress between IO and NEG as its breakdown voltage is generally higher than the triggering voltage of the SCR to which the diode is arranged in parallel. This diode is not drawn in the cross-sectional view of the structure of FIG. 1a. Thus, if such a diode D1 is arranged in parallel, the ESD protection device becomes significantly larger.

In FIG. 2a and FIG. 2b the situation is drawn in case a negative ESD event, which is an ESD event of a negative voltage, is received by the ESD protection device which is implemented in the presented structure 100 of FIG. 2a. Another SCR, which is present in the structure, starts to operate once the voltage difference across the n-p junction from the NBL to the p-doped region 202 reaches the breakdown voltage of that junction. The operation of the ESD protection device, in case of the reception of a negative ESD event, is similar to the operation of the ESD protection device in case of the reception of a positive ESD event, with the minor difference that the current generated by the ESD event is principally conducted towards the substrate, and, consequently, to the voltage supply line which is connected to the substrate.

It is further to be noted that is certain prior art embodiments two SCR's are coupled in series, which means that the structure of FIG. 1a is manufactured twice in each other's neighbourhood and that they are electrically connected to each other via an electrical connection through one of the patterned metal layers manufactured on top of the presented structure to obtain the series arrangement.

SUMMARY OF THE INVENTION

The present invention provides a as described in the accompanying claims.

Specific embodiments of the invention are set forth in the dependent claims.

These and other aspects of the invention will be apparent from and elucidated with reference to the embodiments described hereinafter.

BRIEF DESCRIPTION OF THE DRAWINGS

Further details, aspects and embodiments of the invention will be described, by way of example only, with reference to the drawings. Elements in the figures are illustrated for simplicity and clarity and have not necessarily been drawn to scale.

DETAILED DESCRIPTION OF THE PREFERRED EMBODIMENTS

Figure 1A:
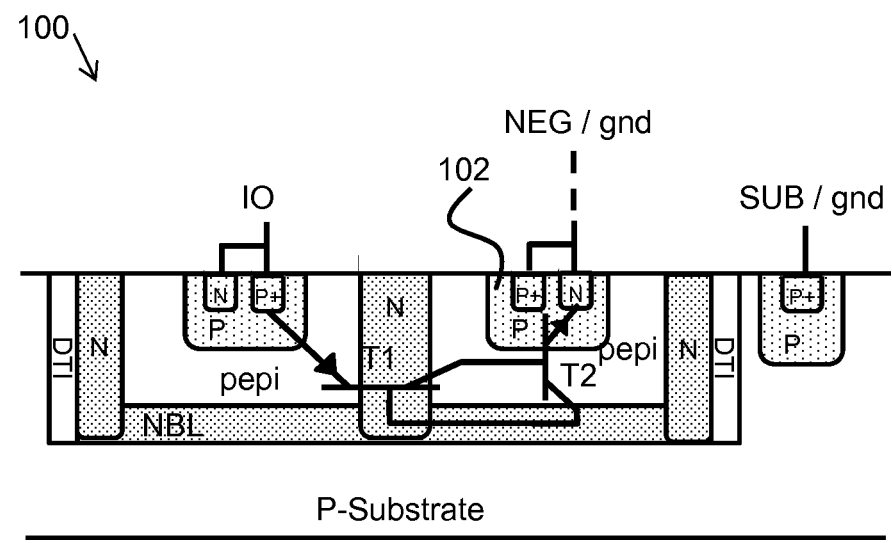
FIGS. 1a, 1b and 1c schematically show an example of a prior art embodiment of an ESD protection device and show the operation of the prior art embodiment in relation to an ESD event of a positive voltage, FIGS. 2a and 2b schematically show an example of the prior art embodiment of an ESD protection device and show the operation of the prior art embodiment in relation to an ESD event of a negative voltage, FIG. 3a schematically shows in a cross-sectional view a structure of a semiconductor device which comprises an ESD protection device, FIG. 3b schematically shows transistors of the circuit of the ESD protection device in the cross-sectional view of FIG. 3a, the shown transistors are relevant for a situation in which an ESD event of a positive voltage is received, FIG. 4a schematically shows a circuit diagram of the ESD protection device implemented in the semiconductor device of FIGS. 3a and 3b, FIG. 4b schematically shows a circuit diagram of another example of an ESD protection device implemented in an example of an semiconductor device of FIG. 6a, FIG. 5 schematically shows the operational characteristics of the ESD protection devices of FIGS. 3 and 4, FIG. 6a schematically shows, in a cross-sectional view, a structure of another semiconductor device in which the another example of an ESD protection device is implemented, FIG. 6b schematically shows transistors of the circuit of the ESD protection device in the cross-sectional view of FIG. 3a, the shown transistors are relevant for a situation in which an ESD event of a negative voltage is received, FIG. 7a schematically shows a circuit diagram in relation to the presented ESD protection device of FIG. 6b, FIG. 7b schematically shows a combined circuit diagram of an ESD protection device which is configured to protect an integrated circuit against ESD events of a positive or a negative voltage, FIG. 8a schematically shows, in a cross-sectional view, an alternative structure of a semiconductor device which comprises an ESD protection device, FIG. 8b schematically shows a circuit diagram of an ESD protection device being implemented in the structure of FIG. 8a, the presented circuit diagram relates to situation in which an ESD event of a positive voltage is received, FIG. 8c schematically shows a further circuit diagram of an ESD protection device being implemented in the structure of FIG. 8a, the presented further circuit diagram relates to situation in which an ESD event of a negative voltage is received, FIG. 9a schematically shows, in a cross-sectional view, a further structure of a semiconductor device which comprises an ESD protection device, FIG. 9b schematically shows a circuit diagram which corresponds to the ESD device implemented in FIG. 9a, the presented circuit diagram relates to situation in which an ESD event of a positive voltage is received, and FIG. 10 schematically shows a method of manufacturing a semiconductor device comprising an ESD protection device together with intermediate manufacturing results.

FIG. 3a schematically shows, in a cross-sectional view, a structure of a semiconductor device 300 which comprises an ESD protection device. Only a cross-sectional view is presented and the skilled person knows that it means that the structure extends for some distance in a direction perpendicular to the plane of the figure. Further, as will be discussed hereinafter, some of the structures enclose a region, which means that they extend for some distance in the direction perpendicular to the plane of the figure and subsequently follow a path parallel to the plane of the figure.

The semiconductor device 300 comprises a p-doped substrate 302. The p-doped substrate 302 has a first side 303. In an optional embodiment, the p-doped substrate 302 may also be subdivided in two layers. The bottom layer (seen in the orientation as presented in FIG. 3a) is a p-doped semiconductor material on which a p-doped epitaxy layer has been manufactured. In this optional embodiment, the p-doped semiconductor material should be comparable to the p-doped epitaxy layer. It is further to be noted that the substrate is electrically brought into contact with a substrate voltage or a ground voltage via substrate connection 326. The substrate connection 326 is coupled to a substrate contact region 328 which is p-doped with a relatively high doping. The substrate contact region 328 extends from the first side for some distance into the p-doped substrate 302 and is embedded in a (regular) p-doped region 330 which has a p-dopant concentration which is in between the p-dopant concentration of the substrate contact region 328 and the p-dopant concentration of the p-doped substrate 302.

Within the p-doped substrate 302 is manufactured an isolation structure to subdivide the p-doped substrate 302 in a remaining portion and an isolated portion. The isolated portion is enclosed by the isolation structure. The isolation structure comprises, at least, an N-buried layer NBL, 338 which is arranged inside the p-doped substrate 302 at a border between the isolated portion and the remaining portion. The N-buried layer NBL, 338 is arranged in a lateral direction and is arranged, seen from the first side, below the interface between the isolated portion and the remaining portion. Optionally, the isolation structure comprises a Deep Trench Isolation structure DTI, 332, 350 which encloses the isolated portion. Further, in an optional embodiment, the isolation structure comprises N-doped regions N, 334, 348 which extend from the first side 303 towards the N-buried layer NBL, 338. The N-doped regions N, 334, 348 are adjacent to the Deep Trench Isolation structure DTI, 332, 350 and enclose the isolated portion.

Within the isolated portion are arranged a first N-doped region N, 340 and a second N-doped region N, 344 which extend from the first side 303 towards the N-buried layer NBL, 338. The first N-doped region N, 340 and the second N-doped region N, 344 subdivide the isolated portion into a first portion pepi1, 336, a second portion pepi2, 342 and a third portion pepi3, 346. The first portion pepi1, 336, a second portion pepi2, 342 and a third portion pepi3, 346 are non-overlapping with each other.

In the first portion pepi1, 336, in the second portion pepi2, 342 and in the third portion pepi3, 346 are arranged, respectively, a first p-doped region P, 308, a second p-doped region P, 316 and a third p-doped region P, 324. Each one of the first p-doped region P, 308, a second p-doped region P, 316 and a third p-doped region P, 324 extends from the first side 303 into its corresponding portion pepin, 336, 342, 346. It is to be noted that the p-doped regions P, 308, 316, 324 do not extends completely towards the N-buried layer NBL, 338. Further, the p-doped regions P, 308, 316, 324 have a p-dopant concentration which is higher than the p-dopant concentration of the respective first portion pepi1, 336, second portion pepi2, 342 and third portion pepi3, 346.

Within the first p-doped region P, 308 is arranged a first P contact region P+, 306 which is connected to a first electrical connection 304 that is the reference voltage REF of the ESD protection device, is generally tied to a ground voltage gnd. It is to be noted that, the first p-doped region P, 308 is not connected to the first electrical connection 304 via an N doped contact region within the first p-doped region P, 308. The p-dopant concentration of the first P contact region P+, 306, is higher than the p-dopant concentration of the first p-doped region P, 308.

In each one of the second p-doped region P, 316 and the third p-doped region P, 324 are arranged an N contact region N, 310, 318 and a P contact region P+, 314, 318. The N contact regions N, 310, 318 and the P contact regions P+, 314, 318 extend from the first side 303 into the respective P-doped regions P, 316, 324, however, they do not extends completely until the bottom of the respective P-doped regions P, 316, 324, seen in a direction from the first side 303—the contact regions N, P+, 310, 314, 318, 322 are surrounded by the respective p-doped regions P, 316, 324. The P contact regions P+, 314, 318 have a p-dopant concentration which is higher than the p-dopant concentration of the P-doped regions P, 316, 324. Thus, within the second p-doped region P, 316 are arranged a first N contact region 310 and a second P contact region 314. A second electrical connection 312 is connected to both the first N contact region 310 and the second P contact region 314. The second electrical connection 312 is configured to be connected to an I/O pad of the semiconductor device 300. Please note that, seen in a direction from left to right in FIG. 3a, the first N contact region 310 may be a second after the second P contact region 314—thus, in another embodiment the position of the first N contact region 310 and of the second P contact region 314 may be reversed. Further, within the third p-doped region P, 324 are arranged a second N contact region 322 and a third P contact region 318. Please note that, seen in a direction from left to right in FIG. 3a, the second N contact region 322 may be a arranged first before the third contact region 318—thus, in another embodiment the position of the second N contact region 322 and of the third P contact region 318 may be reversed. A third electrical connection 320 is connected to the second N contact region 322 and a third P contact region 318. The third electrical connection 320 is configured to be connected to the reference voltage REF or to a ground voltage gnd.

The structure of the semiconductor device 300 implements a specific electrical circuit. FIG. 3b schematically shows transistors T1, T2, T3 of the circuit of the ESD protection device in the cross-sectional view of FIG. 3a. The shown transistors T1, T2, T3 are relevant for a situation in which a positively polarized ESD event is received (being an ESD event of a positive voltage). In FIG. 3b it is assumed that the I/O pad of the semiconductor device 300, and, thus, the second electrical connection 312 receive a fast raising high positive voltage (a positively polarized ESD event). In that case the p-n-p junctions from the second p-doped region towards the second N-doped region 344 to the third p-doped region 324 form pnp transistor T1. The n-p-n junctions from the N-buried layer NBL, 338, to the third p-doped region P, 324 to the second N contact region N, 322 form npn transistor T2. The p-n-p junctions from the first p-doped region P, 308 to the first N-doped region N, 340 to the second p-doped region P, 316 form pnp transistor T3. Transistors T1 and T2 form a Silicon Controlled Rectifier (SCR) device as shown. Transistor T3 is connected with a base to a gate of the SCR device via the N-buried layer NBL, 338.

Figure 4A:
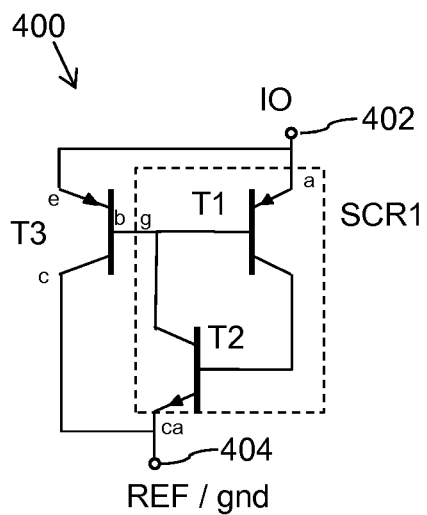

The corresponding circuit diagram of the electrical circuit implemented in the semiconductor device 300, in case that a positively polarized ESD event is received, is presented in FIG. 4a.

FIG. 4a schematically shows a circuit diagram of the ESD protection device 400 implemented in the semiconductor device of FIGS. 3a and 3b.

In FIG. 4a the ESD protection device 400 comprises a first terminal 402 which is configured to be connected to an I/O pad of the integrated circuit which is protected by the ESD protection device 400. The ESD protection device 400 further comprises a second terminal 404 which is configured to be connected to a reference voltage REF/gnd available on the semiconductor device 300 (assuming it is operated under normal condition, which is a condition in which no ESD event is received) or to a ground voltage gnd. A pnp transistor T1 and a npn transistor T2 form a Silicon Controlled Rectifier SCR1. An anode of the Silicon Controlled Rectifier SCR1 is coupled to the first terminal 402 and a cathode of the Silicon Controlled Rectifier SCR1 is coupled to the second terminal 404. The ESD protection device 400 further comprises a pnp transistor T3 which is coupled with an emitter to the first terminal 402, with an collector to the second terminal 404 and with a base to a gate of the Silicon Controlled Rectifier SCR1.

Figure 5:
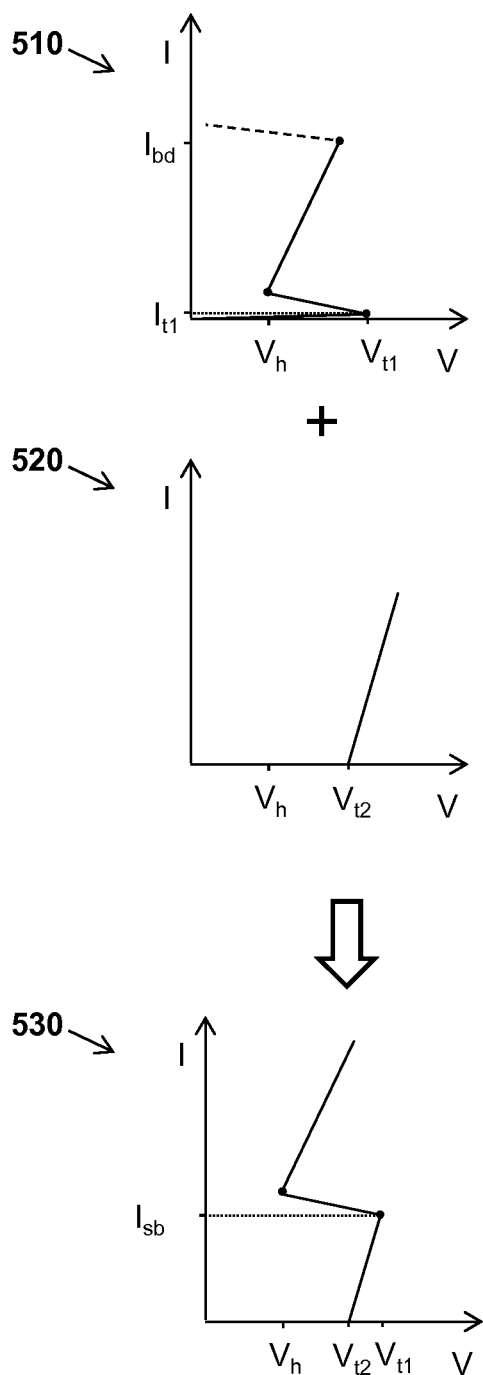

The operation of the ESD protection device 400 is discussed together with FIG. 5.

FIG. 5 schematically shows the operational characteristics of the ESD protection devices 400 of FIGS. 3 and 4.

The Silicon Controlled Rectifier SCR1 has an operational characteristic which is shown in chart 510. If the voltage across the Silicon Controlled Rectifier SCR1 increases towards a first trigger voltage $V_{t1}$, the SCR1 starts to operate. When $V_{t1}$ is reached the current value through the ESD protection devices 400 is equal to the trigger current $I_{t1}$. As soon as the SCR1 starts its operation, the voltage across the SCR1 reduces to holding voltage $V_h$ and from that point onwards, if the current through the SCR1 increases, the voltage across the SCR1 linearly increases as well. The first trigger voltage $V_{t1}$ strongly depends on a distance th1 (see FIG. 3a) between the second N-doped region 344 and the third p-doped region 324 along a shortest line through the third portion pepi3, 346. Thus, the distance th1 (see FIG. 3a) between the second N-doped region 344 and the third p-doped region 324 is configured to obtain a first predefined trigger voltage $V_{t1}$.

The transistor T3 has the operational characteristics as presented in chart 520. When the voltage across the ESD protection device 400 increases, the n-p junction from the first N-doped region 340 towards the first p-doped region 308 is reverse biased. As soon as the breakdown voltage of this junction is reached at the second trigger voltage $V_{t2}$, an avalanche phenomenon by impact ionization is created through this n-p junction. A hole current flows through from the first p-doped region 308. The p-doped region is resistive and once the voltage difference between the first N-doped region 340 (which is connected to ground) and the first p-doped region 308 becomes larger than 0.3 volt, transistor T3 starts to operate. As soon as T3 starts to operate, the current through transistor T3 linearly increases with the voltage across transistor T3. The second trigger voltage $V_{t2}$ strongly depends on a distance th2 (see FIG. 3a) between the first p-doped region 308 and the first N-doped region 340 along a shortest line through of the first portion pepi1, 336. Thus, the distance th2 (see FIG. 3a) between the first p-doped region 308 and the first N-doped region 340 is configured to obtain a first predefined trigger voltage $V_{t2}$.

In an embodiment, the SCR1 is configured to have a first trigger voltage $V_{t1}$ which is larger than the second trigger voltage $V_{t2}$. Thus, the second trigger voltage $V_{t2}$ is reached first when the voltage across the ESD protection device 400 increases. Consequently transistor T3 is switched on first and initially conducts away a current of the ESD event towards the reference voltage pin REF. If, after the start of the operation of the transistor T3, the voltage across the ESD protection device 400 still increases, the first trigger voltage $V_{t1}$ may be reached and the SCR1 is also switched on to conduct more current of the ESD event towards the reference voltage pin REF. This may result in snapback behaviour. However, the snapback behaviour is only observed at a snapback current $I_{sb}$ which is much higher than the trigger current $I_{t1}$ of the SCR1. This behaviour of the ESD protection device 400 is presented in chart 530.

It is advantageous to have the snapback behaviour only at relatively large currents $I_{sb}$ through the ESD protection device 400. Especially in integrated circuits in which one doesn't want to have the snapback behaviour immediately at the moment that the ESD protection device 400 starts is operation, the ESD protection devices 400 of FIGS. 3 and 4 are an advantageous solution. It is further noticed that the ESD event will not raise immediately to the first trigger voltage $V_{t1}$, thus, many ESD events which have a relatively low current will not reach the first trigger voltage $V_{t1}$ and will only reach a maximum voltage which is in between the second trigger voltage $V_{t2}$ and the first trigger voltage $V_{t1}$.

Figure 6A:
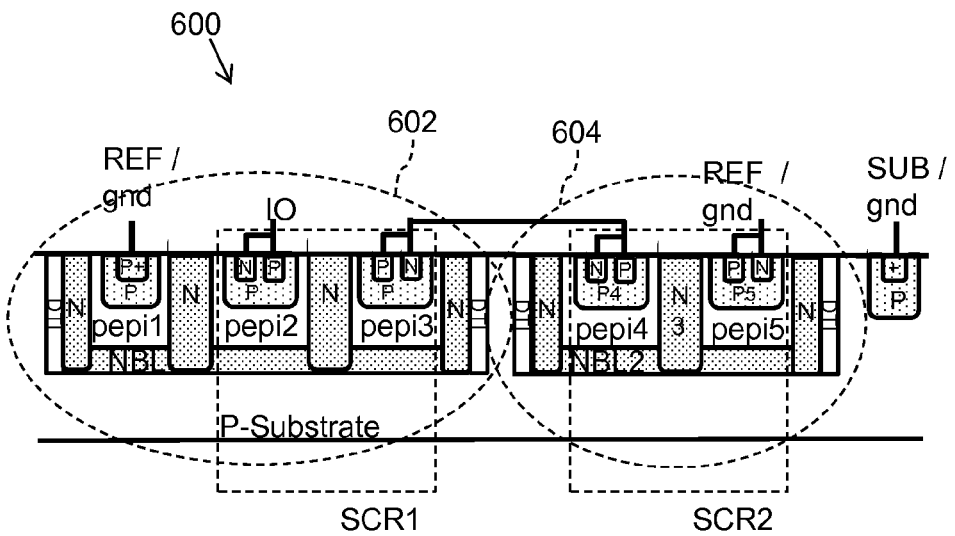

FIG. 6a schematically shows, in a cross-sectional view, a structure of an alternative semiconductor device 600 in which the another example of an ESD protection device is implemented. In FIG. 6a, at the left end 602 of the Figure, an ESD protection device in accordance with previous embodiments is presented. Thus, at the left end 602, a transistor is coupled in parallel to a Silicon Controlled Rectifier SCR1. The third electrical contact 320 of the semiconductor device 300 is configured to be coupled to the reference voltage pin REF which is tied to a reference voltage REF or the ground voltage gnd. In the context of this document, coupling means that it may be connected directly to such a voltage, or that it is being coupled to such a voltage via another electrical component. In the alternative embodiment of FIG. 6a, as shown at the right side 604 of the Figure, the third electrical contact is coupled to a second Silicon Controlled Rectifier SCR2 which provide a coupling to the reference voltage REF or the ground voltage gnd. SCR2 is an SCR which corresponds to known prior art SCR's. The series arrangement of Silicon Controlled Rectifiers SCR1 and SCR2 provide a higher trigger voltage $V_{t1}$ compared to a single Silicon Controlled Rectifier SCR1. A corresponding circuit diagram is presented in FIG. 4b.

Figure 4B:
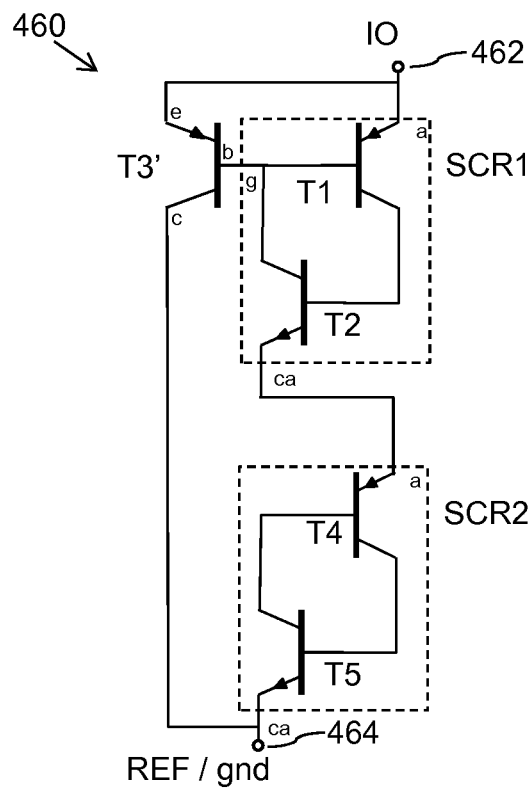

FIG. 4b schematically shows a circuit diagram of another example of an ESD protection device 460 implemented in an example of a semiconductor device 650 of FIG. 6a. As discussed above, the semiconductor device 650 of FIG. 6a comprises a series arrangement of two Silicon Controlled Rectifiers SCR1 and SCR2. This series arrangement of SCR1 and SCR2 is arranged in parallel to transistor T3' which is a transistor similar to transistor T3 of FIGS. 4a and 4b. ESD protection device 460 comprises a third terminal 462 which is configured to be coupled to an I/O device of the integrated circuit implemented on the semiconductor device 600. ESD protection device 460 further comprises a fourth terminal 464 which is configured to be coupled to a reference voltage pin REF which is tied to a reference voltage REF or to a ground voltage gnd. The ESD protection device 460 comprises a first Silicon Controlled Rectifier SCR1, a second Silicon Controlled Rectifier SCR2, and a transistor T3'. An anode of the first Silicon Controlled Rectifier SCR1 is coupled to the third terminal 462, a cathode of the first Silicon Controlled Rectifier SCR1 is coupled to an anode of the second Silicon Controlled Rectifier SCR2, a cathode of the second Silicon Controlled Rectifier SCR2 is coupled to the fourth terminal 464. An emitter of transistor T3' is coupled to the third terminal 462, an collector of the transistor T3' is coupled to the fourth terminal 464 and a base of transistor T3' is coupled to a gate of the first Silicon Controlled Rectifier SCR1. The operational behaviour is similar to the operational behaviour of previously discussed ESD protection devices 400 of FIG. 4a, 4b—see FIG. 5 and the discussion of FIG. 5—however, the first trigger voltage $V_{t1}$ of the series arrangement of the first Silicon Controlled Rectifier SCR1 and the second Silicon Controlled Rectifier SCR2 is higher than the trigger voltage $V_t$ of a single Silicon Controlled Rectifier.

Figure 6B:
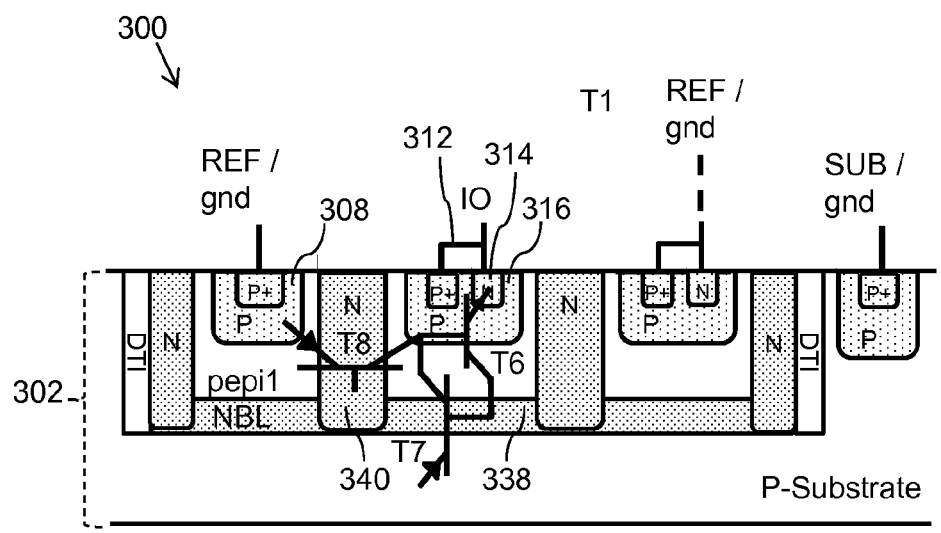

FIG. 6b schematically shows transistors T6, T7, T8 of the circuit of the ESD protection device in the cross-sectional view of the semiconductor device 300 of FIG. 3a, the shown transistors T6, T7, T8 are relevant for a situation in which a negatively polarized ESD event is received. Thus, when the voltage at the I/O pad, and, thus, of the second electrical contact 312 suddenly changes to a relatively large negative voltage, the structure of the semiconductor device 300 start an operation in accordance with the drawn circuit comprising the three drawn transistors T6, T7, T8. The n-p-n junctions from the first N contact region 314 to the second p-doped region 316 to the N-buried layer NBL, 338 form npn transistor T6. The p-n-p junctions from the second p-doped region to the N-buried layer NBL, 338 to the p-doped substrate 302 form a pnp transistor T7. The p-n-p junctions from the first p-doped region 308 to the first n-doped region 340 to the second p-doped region 316 form pnp transistor T8.

Figure 7A:
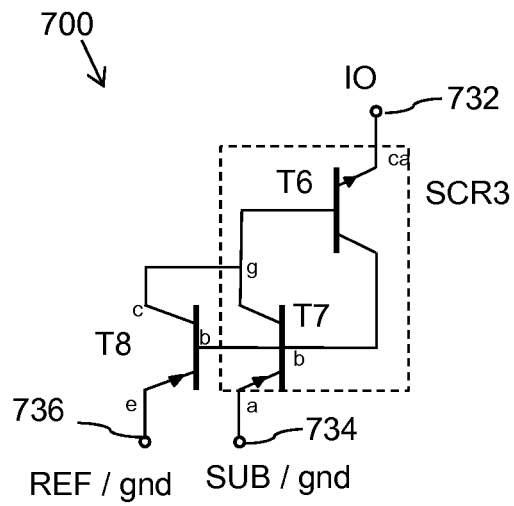

FIG. 7a schematically shows a circuit diagram in relation to the presented ESD protection device implemented in semiconductor device 300 of FIG. 6b. If an ESD event of a negative voltage is received by the I/O pad of the semiconductor device 300, the structure of FIG. 6b forms the ESD protection device 700 as presented in FIG. 7a. Transistors T6, T7 and T8 correspond to the transistors T6 to T8 drawn in Figured 6b. The ESD protection device 700 comprises a fifth terminal 732 which is configured to be connected to an I/O pad of an integrated circuit implemented on the semiconductor device 300. The ESD protection device 700 comprises a sixth terminal 734 for being connected to a substrate voltage SUB or to a ground voltage gnd. The ESD protection device comprises a further terminal 736 for being connected to a reference voltage REF or to a ground voltage gnd. Npn transistor T6 and pnp transistor T7 form a third Silicon Controlled Rectifier SCR3. A cathode of the third Silicon Controlled Rectifier SCR3 is coupled to the fifth terminal 732 and an anode of the third Silicon Controlled Rectifier SCR3 is coupled to the sixth terminal 734. Transistor T7 is coupled with an emitter to the anode of the third Silicon Controlled Rectifier SRC3 and with a collector to a gate of the third Silicon Controlled Rectifier SRC3. A collector of pnp transistor T8 is coupled to the the gate of the third Silicon Controlled Rectifier SCR 3, an emitter of transistor T8 is coupled to the further terminal 736 and a base of transistor T8 is coupled to a base of T7. The operation of ESD protection device 700 is similar to the operation of ESD protection devices 400 with only a difference with respect to the polarity of the voltage across the device and the direction of the current through the de device.

Figure 7B:
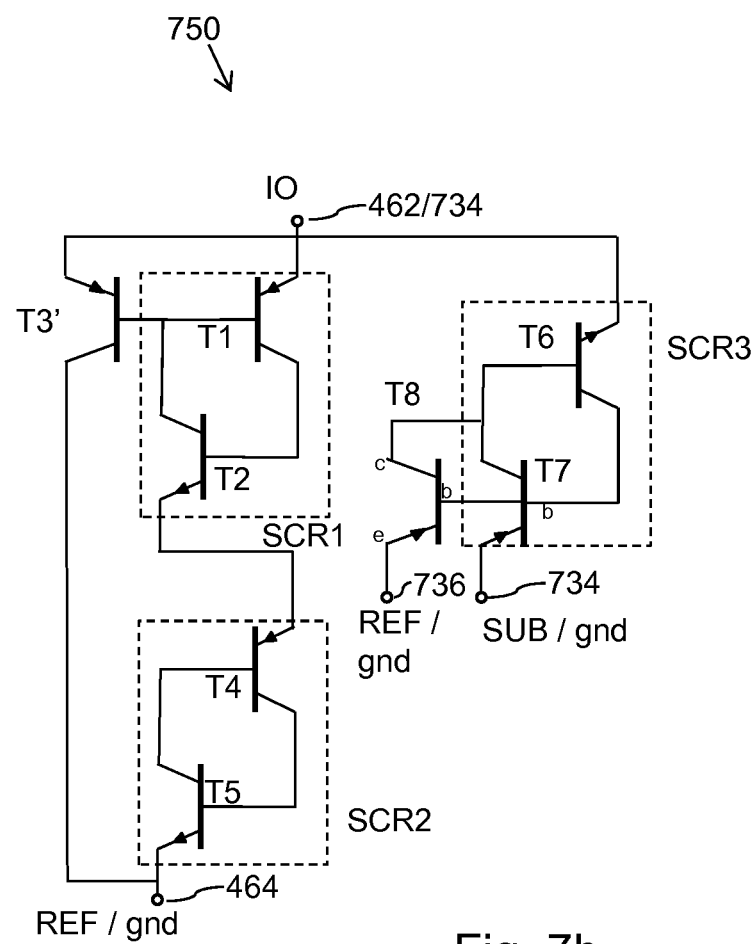

Thus, in an embodiment, a circuitry which represents and ESD protection device for protecting against positively and negatively polarized ESD event, which is implemented in the semiconductor device 300, is a combination of ESD protection device 400 and ESD protection device 700 wherein the first terminal of ESD protection device 400 is coupled to the fifth terminal of ESD protection device 700. This circuitry is not shown. However, FIG. 7b schematically shows a combined circuit of an ESD protection device 750 which is implemented in the structure of semiconductor device 600 of FIG. 6a. The ESD protection device 750 protects against negatively and positively polarized ESD events. The ESD protection device 750 is a combination of ESD protection device 460 of FIG. 4b and ESD protection device 700 of FIG. 7a. The third terminal 462 of ESD protection device 700 is coupled to the fifth terminal 734 of ESD protection device 700. In dependence of the reception of a negatively or positively charged ESD event, the left part or the right part of the circuit will operate to protect the circuitry against ESD events.

FIG. 8a schematically shows, in a cross-sectional view, an alternative structure of a semiconductor device 800 which comprises an ESD protection device. Semiconductor device 800 is similar to semiconductor device 300 of FIG. 3a with only one difference: the first n-doped region 340 is electrically coupled to the second electrical contact 312 via connection 802.

When the semiconductor device 800 receives at the second electrical contact 312 a fast raising positive voltage (positively polarized ESD event), ESD protection device 830 is obtained of which a schematic circuit diagram is drawn in FIG. 8b. Transistors T1 to T3 correspond to transistors T1 to T3 which are drawn in FIG. 3b. A seventh terminal 832 is configured to be coupled to the I/O pad of the semiconductor device 800 of FIG. 8b and a eight terminal 834 is configured to be coupled to a reference voltage pin REF which is generally tied to a reference voltage REF available on the semiconductor device 300 or to a ground voltage gnd. Transistor T1 and T2 form a first Silicon Controlled Rectifier SCR1. An anode of the first Silicon Controlled Rectifier SCR1 is coupled to the seventh terminal 832 and a cathode of the first Silicon Controlled Rectifier SCR1 is coupled to the eight terminal 834. Transistor T3 is coupled with an emitter to the seventh terminal 832 and with a collector to the eight terminal 834. A base of transistor T3 is coupled to a gate of SCR1. Further, the base of transistor T3 (and the gate of the first Silicon Controlled Rectifier SCR1) is coupled to the seventh terminal 832. The operation of the ESD protection device 830 is similar to ESD protection device 400 of FIG. 4a (and, is discussed in the context of FIG. 5).

Figure 1B:
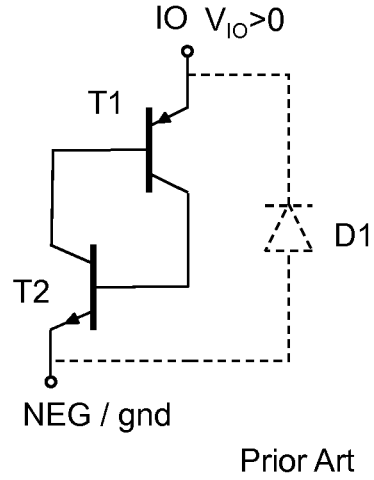
Figure 1C:
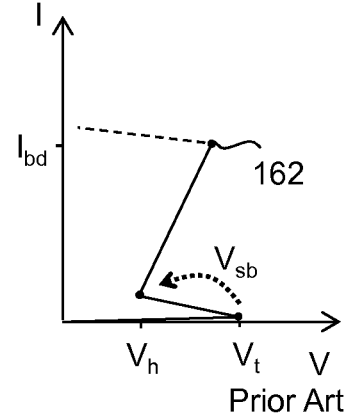
Figure 2A:
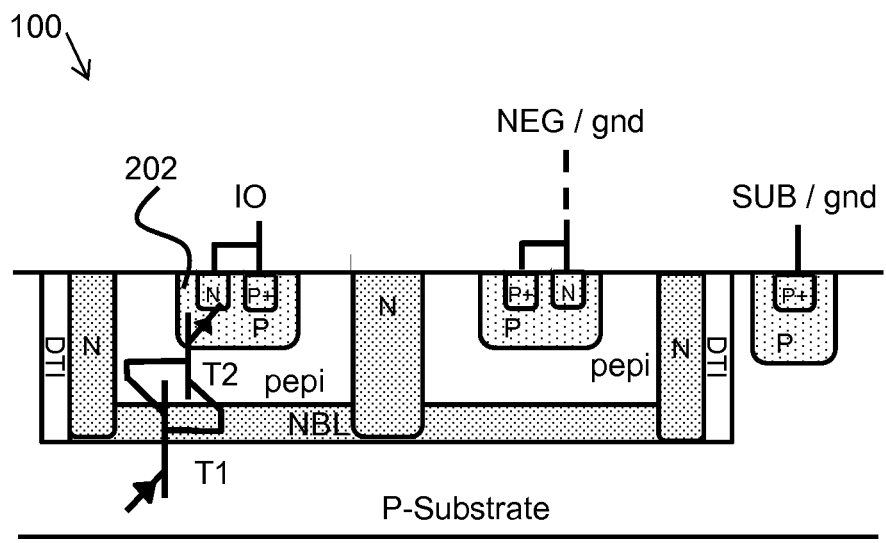
Figure 2B:
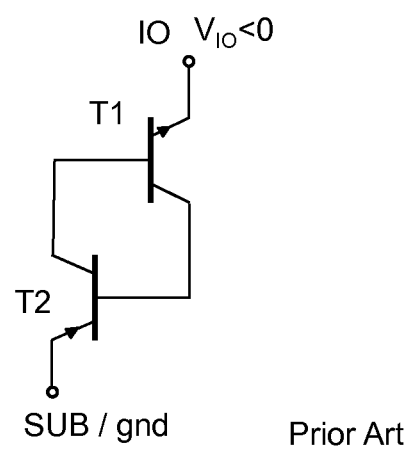

When the semiconductor device 800 receives at the second electrical contact 312 a fast decreasing negative voltage (negatively polarized ESD event), ESD protection device 860 is obtained of which a schematic circuit diagram is drawn in FIG. 8c. Transistors T6 to T8 correspond to transistors T6 to T8 which are drawn in FIG. 6b. A ninth terminal 862 is configured to be coupled to the I/O pad of the semiconductor device 800 of FIG. 8c, a tenth terminal 864 is configured to be coupled to a substrate voltage SUB of the semiconductor device 300 or to a ground voltage gnd, and another terminal 866 is being configured to be coupled to a reference voltage REF or to the ground voltage gnd. Transistor T6 and T7 form a third Silicon Controlled Rectifier SCR3. An anode of the third Silicon Controlled Rectifier SCR3 is coupled to the ninth terminal 862 and a cathode of the third Silicon Controlled Rectifier SCR3 is coupled to the tenth terminal 864. An emitter of the transistor T7 is coupled to the anode of the third Silicon Controlled Rectifier SCR3 and a collector of the transistor T7 is coupled to a gate of the third Silicon Controlled Rectifier SCR3. Transistor T8 is coupled with a collector to the gate of the third Silicon Controlled Rectifier SCR3 and with an emitter to the another terminal 866. A base of transistor T8 is coupled to a base of the transistor T7. The operation of the ESD protection device 830 is different from the operation of ESD protection device 700 of FIG. 7a. When a negative voltage is received at the ninth terminal 862 a diode formed by the emitter-base junction of transistor T8 is forward biased and will conduct the current of the ESD event. Thus, ESD protection device 860 of FIG. 8c has an operational characteristic comparable to a diode. Especially compared to known ESD protection device, the ESD protection devices 830/860 save a relatively large amount of area on a semiconductor device. As discussed in the prior art section of this document, it is known to implement a Silicon Controlled Rectifier in a structure 100 as presented in FIG. 1a. Often, a diode is arranged in parallel to the Silicon Controlled Rectifier to conduct away the current of a negatively polarized ESD event as presented in FIG. 1b. Such a diode is implemented in a separate isolated area of the substrate and, thus, does it cost a relatively large amount of semiconductor area. The diode formed by transistor T8 is much smaller than the separate diode because the diode is integrated in the isolated portion in which the Silicon Controlled Rectifier is implemented as well.

Figure 9A:
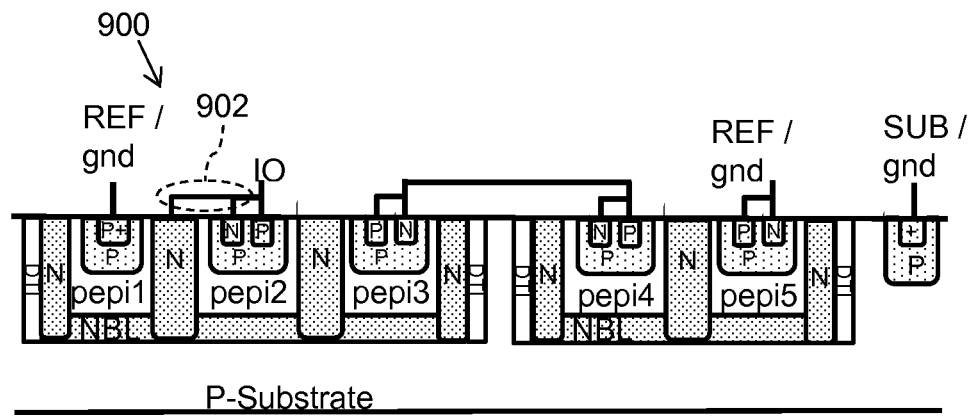
Figure 9B:
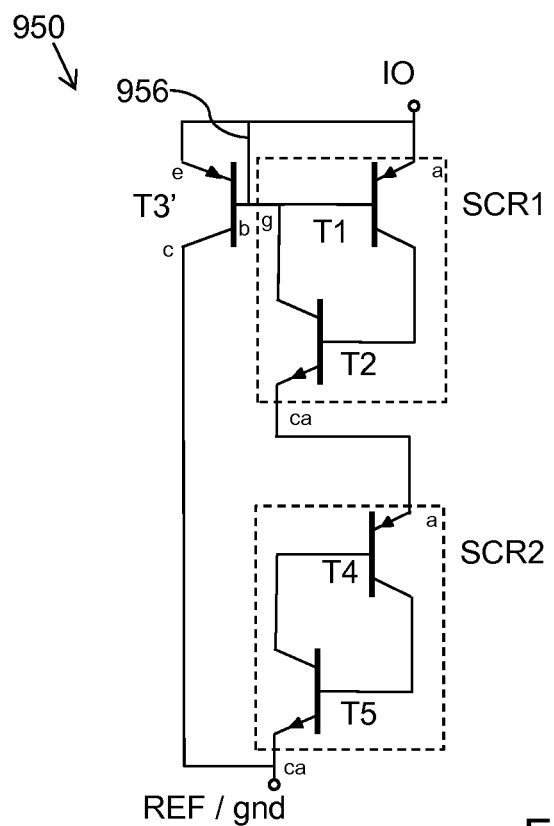

FIG. 9a schematically shows, in a cross-sectional view, a further structure of a semiconductor device 900 which comprises an ESD protection device 950. Semiconductor device 900 is similar to semiconductor device 600 of FIG. 6a with only a minor difference: an electrical connection 902 is provided between the first n-doped region and the second electrical contact. This results in the circuit diagram of an ESD protection device 950 which is schematically shown in FIG. 9b. The electrical connection 902 is drawn as connection 956 in the circuit diagram which is with respect to all the other connections and components equal to the circuit diagram which is presented in FIG. 4b. The operational differences between the operation of ESD protection device 460 of FIG. 4b and the ESD protection device 950 is mainly related to the situation in which an ESD event of a negative voltage is received: in such a situation transistor T3' operates as a diode since the diode formed by the p-n junction from the collector c to the gate g of T3' is forward biased and, thus, a current conduction path is formed from the collector of transistor T3' to its base.

Figure 10:
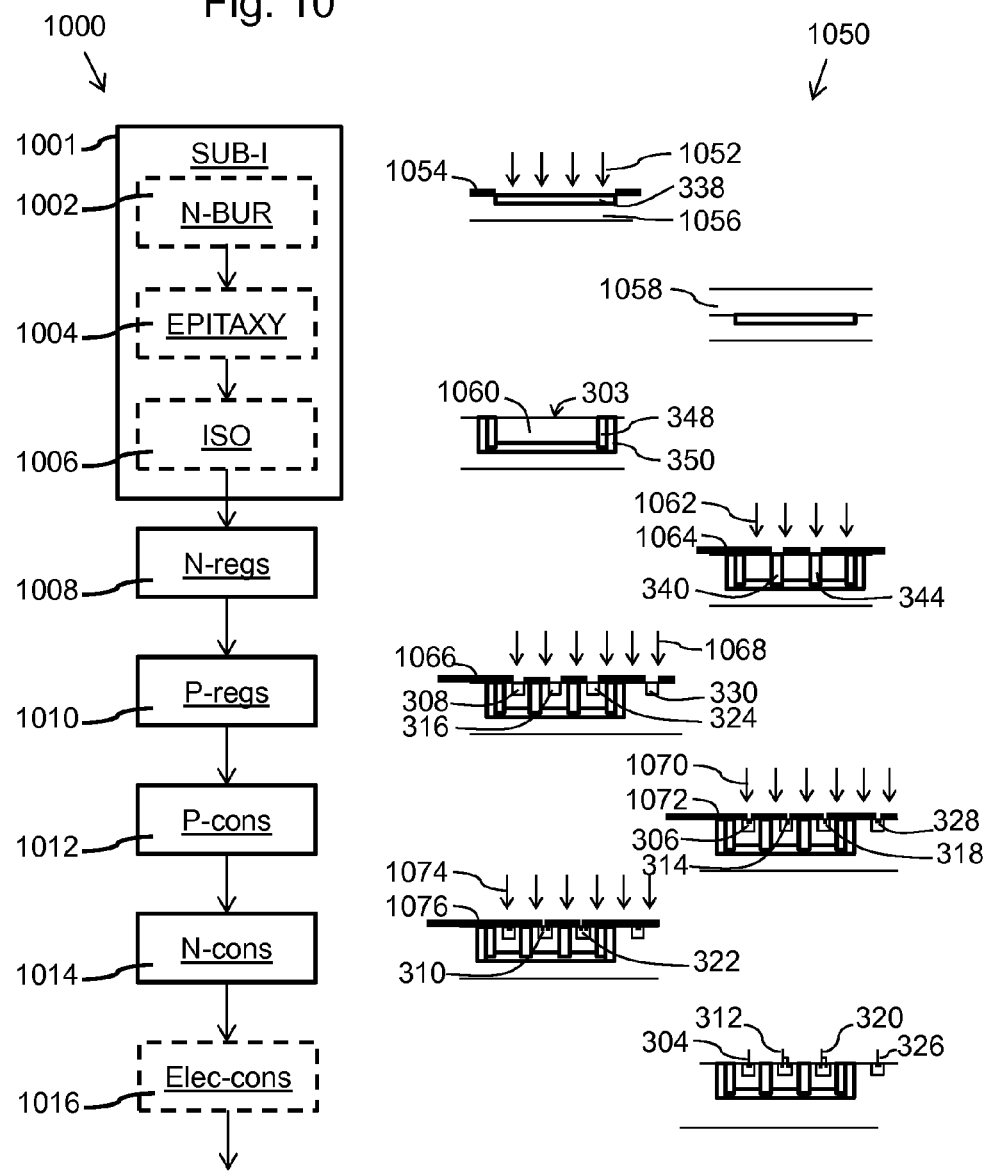

FIG. 10 schematically shows a method 1000 of manufacturing a semiconductor device comprising an ESD protection device together with intermediate manufacturing results 1050.

In stage 1001, SUB-I a semiconductor substrate is provided which comprises a p-doped isolated portion 1060 of the semiconductor substrate. An isolation structure isolates the p-doped isolated portion 1060 from a remaining portion of the semiconductor substrate. The isolation structure comprises at least an N-buried layer 338 which extends in a lateral direction in the interior of the semiconductor substrate. The N-buried layer 338 is arranged at an interface from the isolated portion 1060 to the remaining portion. The p-doped substrate has a first side 303 and the p-doped isolated portion extends form the first side 303 towards the N-buried layer 338.

The stage 1001, SUB-I of providing the semiconductor substrate with the p-doped isolated portion comprises the optional stage of manufacturing 1002 an N-buried layer 338 in a p-doped substrate 1056. The N-buried layer extends from a surface of the p-doped substrate into the p-doped substrate 1056. In an optional stage 1001, SUB-I may be performed by creating a patterned photoresist layer 1054 at the a surface of the p-doped substrate 1056 by, for example, known photolithographic techniques. When the patterned photoresist 1054 layer is present at the first side surface, N implantation 1052 is implanted in the region which is not covered by the pattered photoresist layer 1054. After implanting the N implantation 1052, the photoresist layer 1054 is removed.

In an optional embodiment, the stage 1001, SUB-I of providing the semiconductor substrate with the p-doped isolated portion comprises a stage 1004, EPITAXY of providing a p-doped epitaxy layer 1058 on top of the surface of the p-doped substrate 1056. A surface of the p-doped epitaxy layer 1058 faces the surface of the p-doped substrate 1056 and the p-doped epitaxy layer 1058 has another surface side which is opposite the earlier introduced surface. The another surface of the p-doped epitaxy layer is the first side 303 of the semiconductor substrate. In an optional embodiment, the p-doped epitaxy layer 1060 may be deposited on the p-doped substrate 1056. The p-dopant concentration in the p-doped epitaxy layer 1058 may differ from the p-dopant concentration of the p-doped substrate 1056. In an optional embodiment the p-doped epitaxy layer 1058 and the p-doped substrate 1056 comprise a similar dopant concentration.

In an optional embodiment, the stage 1001, SUB-ISO of obtaining the semiconductor substrate with the p-doped isolated portion comprises a stage 1006, ISO of manufacturing an isolation structure around the p-doped isolated portion 1060 such that the N-buried layer 338 is part of the isolation structure. In an optional embodiment a Deep Trench Isolation structure 350 is manufactured which extends from the first side 303 completely towards the N-buried layer 338. In a further optional embodiment, additional N-doped regions 348 are manufactured adjacent to the Deep Trench Isolation structure, the additional N-doped regions 348 extend from the first side 303 towards the N-buried layer 338. Manufacturing such additional N-doped regions 348 may be done by known photolithographic techniques and known implantation techniques.

In stage 1008, N-regs a first N-doped region 340 and a second N-doped region 344 are manufactured in the p-doped isolated portion 1060. The N-doped regions 340, 344 extends from the top surface towards the N-buried layer 338. The N-doped regions 340, 344 are arranged such that they subdivide the p-doped isolated portion into a first portion, a second portion and a third portion. In an optional embodiment, the current stage 1008 may be performed by creating a patterned photoresist layer 1064 at the first side 303 of the p-doped isolated region by, for example, known photolithographic techniques. When the patterned photoresist 1064 layer is present at the first side, N implantation 1062 is implanted in the region which is not covered by the pattered photoresist layer 1064. After implanting the N implantation 1062, the photoresist layer 1064 is removed.

In stage 1010, P-regs a first p-doped region 308, a second p-doped region 316 and a third p-doped region 324 are manufactured into, respectively, the first portion, the second portion and the third portion. The manufactured first p-doped region 308, the manufactured second p-doped region 316 and the manufactured third p-doped region 324 extend from the first side 303 into, respectively, the first portion, the second portion and the third portion. Further, the manufactured first p-doped region 308, the manufactured second p-doped region 316 and the manufactured third p-doped region 324 have a p-dopant concentration which is higher than the p-dopant concentration of the p-doped isolated portion 1060. In an optional embodiment, the current stage 1010, P-regs may be performed by creating a patterned photoresist layer 1066 at the first side 303 of the p-doped isolated region by, for example, known photolithographic techniques. When the patterned photoresist 1066 layer is present at the top surface, P implantation 1068 is implanted in the regions which are not covered by the pattered photoresist layer 1066. After implanting the P implantation 1068, the photoresist layer 1066 is removed. In an optional embodiment, the current stage 101, P-regs may also comprise the manufacturing of a fourth p-doped region 330 in a remaining portion of the semiconductor substrate. The remaining portion of the semiconductor substrate is a portion different from the isolated portion. The fourth p-doped region 330 extends from the first side 303 into the remaining portion. The p-dopant concentration of the fourth p-doped region 330 is larger than the p-dopant concentration of the semiconductor substrate.

In stage 1012, P-Cons a first P contact region 306, a second P contact region 314 and a third P contact region 318 are manufactured into, respectively, the first p-doped region 308, the second p-doped region 316 and the third p-doped region 324. The first P contact region 306, the second P contact region 314 and the third P contact region 318 extend from the first side 303 into, respectively, the first p-doped region 308, the second p-doped region 316 and the third p-doped region 324. The manufactured first P contact region 306, the manufactured second P contact 314 region and the manufactured third P contact region 318 have a p-dopant concentration which is larger than the p-dopant concentration of, respectively, the first p-doped region 308, the second p-doped region 316 and the third p-doped region 324. In an optional embodiment, the current stage 1012, P-Cons may be performed by creating a patterned photoresist layer 1072 at the first side 303 of the p-doped isolated region by, for example, known photolithographic techniques. When the patterned photoresist 1072 layer is present at the top surface, P implantation 1070 is implanted in the regions which are not covered by the pattered photoresist layer 1072. After implanting the P implantation 1070, the photoresist layer 1072 is removed. In an optional embodiment, the current stage 1012, P-Cons may also comprise the manufacturing of a fourth P contact region 328 in the fourth p-doped region 330. The fourth P contact region 328 extends from the first side 303 into the fourth p-doped region 330. The p-dopant concentration of the fourth contact region 328 is larger than the p-dopant concentration of the fourth p-doped region 330.

In stage 1014, N-Cons a first N contact region 310 and a second N contact region 322 are manufactured into, respectively, the second p-doped region 316 and the third p-doped region 324. The first N contact region 310 and the second N contact region 322 extend from the first side 303 into, respectively, the second p-doped region 316 and the third p-doped region 324. The manufactured first N contact region 310 and the manufactured second N contact 322 region have a majority of N-type dopants. In an optional embodiment, the current stage 1014, N-Cons may be performed by creating a patterned photoresist layer 1076 at the first side 303 of the p-doped isolated region by, for example, known photolithographic techniques. When the patterned photoresist 1076 layer is present at the top surface, N implantation 1074 is implanted in the regions which are not covered by the pattered photoresist layer 1076. After implanting the N implantation 1074, the photoresist layer 1076 is removed.

In an optional stage 1016, Elec-cons, electrical contacts are manufactured. A first electrical contact is brought in contact with the first P contact region 306. A second electrical contact is electrically connected to the first N contact region 310 and the second P contact region 314. A third electrical contact is electrically connected to the second N contact region 322 and third P contact region 318. In an optional embodiment of this optional stage 1016, Elec-cons, a fourth electrical contact is electrically connected to the fourth P contact region 328. The first electrical contact, the second electrical contact and/or the third electrical contact may be created by creating contact holes in an insulation layer which is manufactured on top of the top surface and by creating electrical connections in one of the patterned metal layers which are manufactured on top of the insulation layer.

It is to be noted that additional details of the manufacturing method of the semiconductor device may, for example, be found in US2011/0176244.

In summary, the current application relates to: A semiconductor device is provided which comprises an ESD protection device. The structure of the semiconductor device comprises a p-doped isolated region in which a structure is manufactured which operates as a Silicon Controlled Rectifier which is coupled between an I/O pad and a negative or ground voltage. The semiconductor device 300 also comprises a pnp transistor which is coupled parallel to the Silicon Controlled Rectifier. The base of the transistor is coupled to the gate of the Silicon Controlled Rectifier. In an optional embodiment, the base and gate are also coupled to the I/O pad.

In the foregoing specification, the invention has been described with reference to specific examples of embodiments of the invention. It will, however, be evident that various modifications and changes may be made therein without departing from the broader spirit and scope of the invention as set forth in the appended claims. For example, the connections may be an type of connection suitable to transfer signals from or to the respective nodes, units or devices, for example via intermediate devices. Accordingly, unless implied or stated otherwise the connections may for example be direct connections or indirect connections.

The semiconductor substrate described herein can be any semiconductor material or combinations of materials, such as gallium arsenide, silicon germanium, silicon-on-insulator (SOI), silicon, monocrystalline silicon, the like, and combinations of the above. As used herein, the term "semiconductor" is intended to include any semiconductor whether single crystal, poly-crystalline or amorphous and to include type IV semiconductors, non-type IV semiconductors, compound semiconductors as well as organic and inorganic semiconductors. Further, the terms "substrate" and "semiconductor substrate" are intended to include single crystal structures, polycrystalline structures, amorphous structures, thin film structures, layered structures as, for example, and not intended to be limiting, semiconductor-on-insulation (SOI) structures, and combinations therefore. For convenience of explanation and not intended to be limiting, semiconductor devices and methods of fabrication are described herein for silicon semiconductors but persons skilled in the art will understand that other semiconductor materials may also be used. Additionally, various device types and/or dopes semiconductor regions may be identified as being of N type or P type, but this is merely for convenience of description and not intended to be limiting, and such identification may be replaced by the more general description of being of a "first conductivity type" or a "second, opposite, conductivity type" where the first type may be either N or P type and the second type then is either P or N type.

The conductors as discussed herein may be illustrated or described in reference to being a single conductor, a plurality of conductors, unidirectional conductors, or bidirectional conductors. However, different embodiments may vary the implementation of the conductors. For example, separate unidirectional conductors may be used rather than bidirectional conductors and vice versa. Also, plurality of conductors may be replaced with a single conductor that transfers multiple signals serially or in a time multiplexed manner. Likewise, single conductors carrying multiple signals may be separated out into various different conductors carrying subsets of these signals. Therefore, many options exist for transferring signals.

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

Although the invention has been described with respect to specific conductivity types or polarity of potentials, skilled artisans appreciated that conductivity types and polarities of potentials may be reversed.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Thus, it is to be understood that the architectures depicted herein are merely exemplary, and that in fact many other architectures can be implemented which achieve the same functionality. In an abstract, but still definite sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermediate components. Likewise, any two components so associated can also be viewed as being "operably connected," or "operably coupled," to each other to achieve the desired functionality. It is further to ben noted, when two components of an electronic circuit or of a semiconductor device are "coupled" to each other, there is at least an electrical conducting path between them. However, "coupling" does not mean that no other devices may be present between the two components and when two components are coupled to each other, other electronic components may be present on the electrical connection between the two components.

Also, the invention is not limited to physical devices or units implemented in non-programmable hardware but can also be applied in programmable devices or units able to perform the desired device functions by operating in accordance with suitable program code. Furthermore, the devices may be physically distributed over a number of apparatuses, while functionally operating as a single device. For example, Also, devices functionally forming separate devices may be integrated in a single physical device. For example, However, other modifications, variations and alternatives are also possible. The specifications and drawings are, accordingly, to be regarded in an illustrative rather than in a restrictive sense.

In the claims, any reference signs placed between parentheses shall not be construed as limiting the claim. The word 'comprising' does not exclude the presence of other elements or steps then those listed in a claim. Furthermore, Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements The mere fact that certain measures are recited in mutually different claims does not indicate that a combination of these measures cannot be used to advantage.

The invention claimed is:

1. A first ESD protection circuit for protecting an integrated circuit against relatively high positive voltages received an I/O pad of the integrated circuit, the first ESD protection circuit comprising:
    a first terminal configured to be coupled to the I/O pad of the integrated circuit;
    a second terminal configured to be coupled to a reference voltage or to a ground voltage;
    a first Silicon-controlled rectifier, the first Silicon-controlled rectifier coupled with an anode connected to the first terminal and connected with a cathode to the second terminal;
    a first pnp transistor, the first pnp transistor coupled with an emitter to the first terminal, coupled with a collector to the cathode, and connected with a base connected to a gate of the first Silicon-controlled rectifier.

2. A first ESD protection circuit according to claim 1, wherein the base and the emitter of the first pnp transistor are connected together.

3. A first ESD protection circuit according to claim 1 further comprising:
    a second Silicon-controlled rectifier, the second Silicon-controlled rectifier arranged in between the first Silicon-controlled rectifier and the second terminal, an anode of the second Silicon-controlled rectifier connected to the cathode of the first Silicon-controlled rectifier, a cathode of the second Silicon-controlled rectifier being connected to the second terminal.

4. An integrated circuit comprising the first ESD protection circuit of claim 1, and further comprising a second ESD protection circuit for protecting an integrated circuit against relatively large negative voltages received an I/O pad of the integrated circuit, the second ESD protection circuit comprising:
    a third terminal configured to be coupled to the I/O pad of the integrated circuit;
    a fourth terminal configured to be coupled to a substrate voltage or to a ground voltage;
    a further terminal configured to be coupled to a reference voltage or to the ground voltage;
    a third Silicon-controlled rectifier, the third Silicon-controlled rectifier coupled with a cathode to the third terminal and coupled with an anode to the fourth terminal, the third Silicon-controlled rectifier formed by a third transistor and a fourth pnp transistor, the fourth pnp transistor coupled with an emitter to the anode of the third Silicon-controlled rectifier and with a collector to a gate of the third Silicon-controlled rectifier;
    a second pnp transistor, the second pnp transistor coupled with a collector to a gate of the third Silicon-controlled rectifier, coupled with an emitter to the further terminal, and coupled with a base to the a base of the fourth pnp transistor.

5. A second ESD protection circuit according to claim 4, wherein the base of the second pnp transistor is also coupled to the third terminal.

6. An integrated circuit comprising at least one of the first ESD protection circuit according to claim 1.

7. An integrated circuit comprising a first ESD protection circuit for protecting an integrated circuit against relatively high positive voltages received an I/O pad of the integrated circuit, and a second ESD protection circuit for protecting an integrated circuit against relatively large negative voltages received an I/O pad of the integrated circuit;
    the first ESD protection circuitry including
        a first terminal configured to be coupled to the I/O pad of the integrated circuit;
        a second terminal configured to be coupled to a reference voltage or to a ground voltage;
        a first Silicon-controlled rectifier, the first Silicon-controlled rectifier coupled with an anode to the first terminal and coupled with a cathode to the second terminal;
        a first pnp transistor, the first pnp transistor coupled with an emitter to the first terminal, coupled with a collector to the second terminal, and coupled with a base to the a gate of the first Silicon-controlled rectifier;
    the second ESD protection circuitry including
        a third terminal configured to be coupled to the I/O pad of the integrated circuit;
        a fourth terminal configured to be coupled to a substrate voltage or to a ground voltage;
        a further terminal configured to be coupled to a reference voltage or to the ground voltage;
        a third Silicon-controlled rectifier, the third Silicon-controlled rectifier coupled with a cathode to the third terminal and coupled with an anode to the fourth terminal, the third Silicon-controlled rectifier formed by a third transistor and a fourth pnp transistor, the fourth pnp transistor coupled with an emitter to the anode of the third Silicon-controlled rectifier and with a collector to a gate of the third Silicon-controlled rectifier;
        a second pnp transistor, the second pnp transistor coupled with a collector to a gate of the third Silicon-controlled rectifier, coupled with an emitter to the further terminal, and coupled with a base to the a base of the fourth pnp transistor.

8. A second ESD protection circuit according to claim 7, wherein the base of the second pnp transistor is also coupled to the third terminal.

* * * * *